United States Patent
Takasu et al.

(10) Patent No.: US 6,492,236 B2
(45) Date of Patent: Dec. 10, 2002

(54) METHOD OF MANUFACTURING A SEMICONDUCTOR DEVICE WITH A SILICIDE

(75) Inventors: Hiroaki Takasu, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/096,394

(22) Filed: Mar. 12, 2002

(65) Prior Publication Data

US 2002/0151144 A1 Oct. 17, 2002

(30) Foreign Application Priority Data

Apr. 10, 2001 (JP) .......................................... 2001-111470

(51) Int. Cl.⁷ ............................................ H01L 21/336
(52) U.S. Cl. ...................... 438/305; 438/307; 438/655
(58) Field of Search ................................. 438/305, 306, 438/307, 592, 655, 657

(56) References Cited

U.S. PATENT DOCUMENTS

| | | | |
|---|---|---|---|
| 6,180,477 B1 | * | 1/2001 | Liao ............................. 438/305 |
| 6,291,354 B1 | * | 9/2001 | Hsiao et al. ................. 438/655 |
| 6,316,319 B1 | * | 11/2001 | Ishida et al. ................ 438/305 |
| 6,383,906 B1 | * | 5/2002 | Wieczorek et al. ......... 438/305 |
| 6,399,451 B1 | * | 6/2002 | Lim et al. .................... 438/305 |

* cited by examiner

Primary Examiner—Chandra Chaudhari
(74) Attorney, Agent, or Firm—Adams & Wilks

(57) ABSTRACT

There is provided a manufacturing method for obtaining an MOS transistor which has a homopolar gate structure and a high-melting metallic silicide structure and is suitable even for high speed operation, while at the same time having a structure in which a sufficient withstand voltage can be attained by forming, by a simple method, low concentration drain regions with a long distance. A source and a drain, which have a low concentration, are formed and a thick insulating film and positive resist is formed (applied) on a gate electrode. Then, the positive resist is exposed at an amount of exposure suitable to expose a portion corresponding to a film thickness of the positive resist formed on a flat portion of the thick insulating film as a base and developed. The thick insulating film is etched by an amount substantially corresponding to a film thickness thereof by anisotropic etching using as a mask those portions of the positive resist partially remaining in a step portion. An impurity having a high concentration is simultaneously introduced into the source, the drain, and the gate electrode using a remaining portion of the thick insulating film as a mask. After that, high-melting metallic silicide is formed on exposed portions of the gate electrode and the source and drain regions of the MOS transistor, respectively.

3 Claims, 1 Drawing Sheet

METHOD OF MANUFACTURING A SEMICONDUCTOR DEVICE WITH A SILICIDE

BACKGROUND OF THE INVENTION

1. Field of the Invention

The present invention relates to a method of manufacturing a semiconductor device.

2. Description of the Related Art

A mask-offset drain (offset region is also formed in the source side in some cases) structure has been known as one of conventional high withstand voltage (about 10 V) MOS transistor structures. This structure is characterized in that a low concentration drain region (offset drain region) having a relatively long distance of about 0.5 to 1.0 ìm is provided near the gate electrode by using a photo mask, with the result that an electric field is relaxed to attain a higher withstand voltage. Further, an overlap capacitance between the gate and the drain is small. As a result, a gate charging speed is high in the case where this structure is used for a circuit, so that the mask-offset drain structure is suit able high-speed operation. Further, a drain impurity concentration in the offset region is low, so that a depletion layer can be extended, with the result that a drain withstand voltage can be increased. At this time, since a length L of the transistor can be shortened, it is suitable as an element having high driving power and a high withstand voltage.

On the other hand, with respect to a fine MOS transistor having a slightly low voltage range of about 5 V, a transistor of an LDD structure including source and drain regions each having a low impurity concentration, which are called LDDS, is known. The source and drain regions each having a low impurity concentration are defined in a self-alignment manner with respect to the gate electrode by side spacers and the length thereof is about 0.1 to 0.2 $\mu$m.

In the case of the transistor of the LDD structure, a homopolar gate and high-melting metallic silicide (including self-aligning silicide) can be also achieved as means for further improving the performance of the transistor.

However, when adopting a homopolar gate structure and a high-melting metallic silicide structure for the MOS transistor having the mask-offset drain structure, which is suitable for an application in which a withstand voltage is required, there arises a problem such that, since it is necessary to form low concentration drain regions having a distance longer than that required in the MOS transistor having the LDD structure, the entire processing steps become very complicated.

SUMMARY OF THE INVENTION

The present invention has been made to solve the above problem, and an object of the present invention is to provide a manufacturing method capable of obtaining an MOS transistor which has a homopolar gate structure and a high-melting metallic silicide structure and is suitable even for high speed operation, while at the same time having a structure in which a sufficient withstand voltage can be attained by forming, by a simple method, low concentration drain regions with a long distance.

In order to achieve the above-mentioned object, according to the present invention, there is provided a method of manufacturing a semiconductor device, characterized by comprising the steps of: patterning a gate electrode formed on a thin insulating film on a silicon substrate, into a predetermined shape and then forming source and drain regions having a relatively low concentration by an ion implantation method using the gate electrode as a mask; forming a thick insulating film on the gate electrode, thickly applying a positive resist onto an entire surface of the thick insulating film, and then exposing the positive resist at an amount of exposure suitable to expose a portion corresponding to a film thickness of the positive resist formed on a flat portion of the thick insulating film as a base and developing the exposed positive resist; etching the thick insulating film by an amount substantially corresponding to a film thickness thereof by anisotropic etching, using those portions of the positive resist partially remaining in a step portion as a mask; removing the remaining portions of the positive resist and then introducing an impurity having a high concentration into the gate electrode and the source and drain regions of an MOS transistor using a remaining portion of the thick insulating film as a mask; and then forming a silicide layer on exposed portions of the gate electrode and the source and drain regions of the MOS transistor, respectively, to thereby obtain a high-melting metallic silicide structure.

According to the present invention, there is provided a method of manufacturing a semiconductor device, by which it is capable of obtaining an MOS transistor having low concentration drain regions with a long distance, by a simple method and at a low cost.

DETAILED DESCRIPTION OF THE PREFERRED EMBODIMENT

Hereinafter, a preferred embodiment of the present invention will be described with reference to the drawings.

FIGS. 1A to 1F are cross sectional views indicating step order in one embodiment of a method of manufacturing an N-type MOS transistor according to the present invention.

Figure 1A:
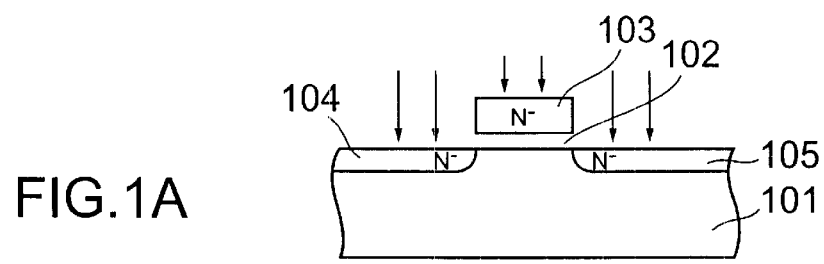
FIGS. 1A to 1F are cross sectional views indicating step order in one embodiment of a method of manufacturing an N-type MOS transistor according to the present invention.

As shown in FIG. 1A, a gate oxide film 102 having a film thickness of, for example, 100 angstroms is formed on a P-type silicon substrate 101. A gate electrode 103 composed of a polysilicon thin film having a film thickness of, for example, 2500 angstroms is formed thereon and patterned in a predetermined shape. At this point, an impurity has not been introduced into the gate electrode 103 composed of the polysilicon thin film. Subsequently, an N-type impurity such as phosphorus or arsenic having a low concentration is introduced by an ion implantation method using the gate electrode 103 as a mask to form a low concentration source region 104 and a low concentration drain region 105.

Figure 1B:
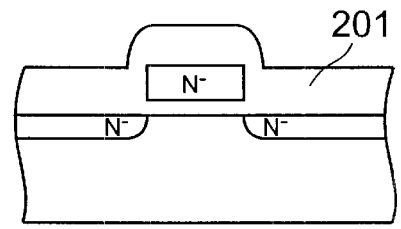

Next, as shown in FIG. 1B, a thick silicon oxide film 201 having a thickness of about 5000 angstroms is deposited by a CVD method or the like so as to sufficiently cover the gate electrode 103.

Figure 1C:
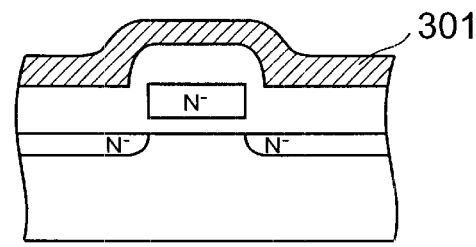

Subsequently, as shown in FIG. 1C, a positive resist 301 is applied onto the thick silicon oxide film 201 such that a film thickness of a positive resist to be formed on a flat portion of the thick silicon oxide film 201 as a base becomes about 1 micron. At this time, the thickness of the positive resist 301 formed on a stepped portion of the thick silicon oxide film 201, which is produced due to a step caused by the gate electrode 103 below, becomes larger than that formed on the flat portion thereof.

Figure 1D:
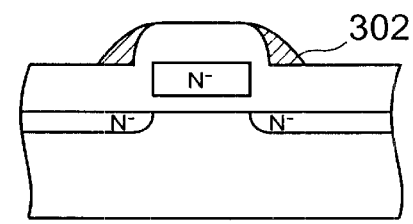

Then, as shown in FIG. 1D, when exposure is performed at the amount of exposure necessary to suitably expose the positive resist 301 having a thickness of 1 micron, which is formed on the flat portion of the thick silicon oxide film 201 as a base, photosensitivity of the positive resist 301 formed on the stepped portion of the thick silicon oxide film 201 becomes insufficient. Thus, positive resists 302 that remain in a spacer-like fashion are formed after development.

Figure 1E:
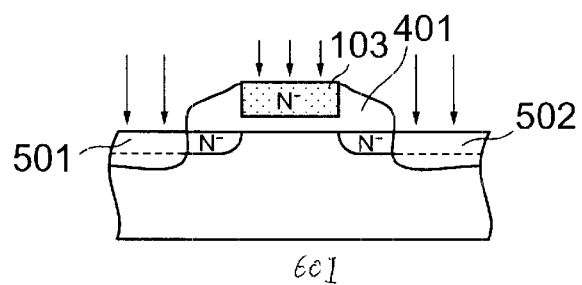

Next, as shown in FIG. 1E, the thick silicon oxide film 201 is etched by anisotropic etching using the positive resists 302 remaining in a spacer-like fashion as masks and then the positive resists 302 remaining in a spacer-like fashion are removed. Thus, side spacers 401 composed of a portion of the thick silicon oxide film 201 having a long transverse distance of about 0.5 µm or more can be formed.

Subsequently, an N-type impurity such as phosphorus or arsenic is introduced by an ion implantation method using the side spacers 401 as masks to thereby form a high concentration source region 501 having a high impurity concentration and a high concentration drain region 502 having a high impurity concentration. Simultaneously, a sufficient amount of the N-type impurities is also introduced into the gate electrode 103 so that gate depletion and the like are prevented to thereby minimize the resistance.

Figure 1F:
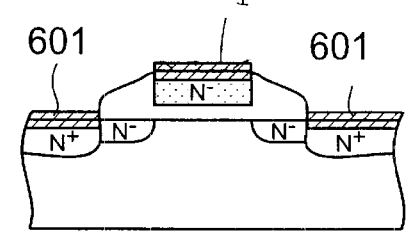

Next, as shown in FIG. 1F, in order to remove a thin silicon oxide film naturally formed on the surface, an extremely light etching is performed for the silicon oxide film. After that, a so-called silicide step is performed. That is, silicide layers 601 are selectively formed on the surfaces of the high concentration source region 501 and the high concentration drain region 502 where the silicon is exposed and on the surface of the gate electrode 103 where the polysilicon is exposed. Thus, an MOS transistor having a high-melting metallic silicide structure is completed. When the silicide structure is used, since resistances of the gate electrode 103 and the source and drain portions of the MOS transistor can be reduced, this can greatly contribute to high-speed operation of an IC.

The above descriptions using FIGS. 1A to 1F are directed to the N-type MOS transistor. However, a P-type MOS can also be easily formed when an N-type silicon substrate is used instead of the p-type silicon substrate 101 or an N-well region or the like is formed to form a transistor therein, and then a P-type impurity such as boron is used instead of an N-type impurity. Also, according to the present invention, in a CMOS circuit in which the N-type MOS transistor and the P-type MOS transistor are combined, a CMOS circuit having a homopolar gate structure and a silicide structure can be simply formed.

As described above, according to the present invention, by using a technique characterized by comprising the steps of: patterning a gate electrode formed on a thin insulating film on a silicon substrate, into a predetermined shape and then forming source and drain regions having a relatively low concentration by an ion implantation method using the gate electrode as a mask; forming a thick insulating film on the gate electrode, thickly applying a positive resist onto an entire surface of the thick insulating film, and then exposing the positive resist at an amount of exposure suitable to expose a portion corresponding to a film thickness of the positive resist formed on a flat portion of the thick insulating film as a base and developing the exposed positive resist; etching the thick insulating film by an amount substantially corresponding to a film thickness thereof by anisotropic etching using those portions of the positive resist partially remaining in a step portion as a mask; removing the remaining positive resist and then introducing an impurity having a high concentration into the gate electrode and the source and drain regions of an MOS transistor using a remaining portion of the thick insulating film as a mask; and then forming a silicide layer on exposed portions of the gate electrode and the source and drain regions of the MOS transistor, respectively, to thereby obtain a high-melting metallic silicide structure, it becomes easier to use a homopolar gate structure and a high-melting metallic silicide structure (including a self-aligning silicide structure) for an MOS transistor having the mask-offset drain structure.

In particular, low concentration drain regions having a long distance are required for obtaining a withstand voltage as compared with an MOS transistor having the LDD structure. In this context, it is quite a significant advantage that these regions can be formed extremely easily and in a self-alignment manner with respect to the gate electrode.

What is claimed is:

1. A method of manufacturing a semiconductor device comprising the steps of:

patterning a gate electrode formed on a thin insulating film on a silicon substrate, into a predetermined shape and a predetermined size and then forming source and drain regions having a relatively low concentration by an ion implantation method using the gate electrode as a mask;

forming a thick insulating film on the gate electrode, thickly applying a positive resist onto an entire surface of the thick insulating film, and then exposing the positive resist at an amount of exposure suitable to expose a portion corresponding to a film thickness of the positive resist formed on a flat portion of the thick insulating film as a base and developing the exposed positive resist;

etching the thick insulating film by an amount substantially corresponding to a film thickness thereof by anisotropic etching, using as a mask portions of the positive resist partially remaining in a step portion;

removing the remaining portions of the positive resist and then introducing an impurity having a high concentration into the gate electrode and the source and drain regions of an MOS transistor using a remaining portion of the thick insulating film as a mask; and forming a silicide layer on exposed portions of the gate electrode and the source and drain regions of the MOS transistor, respectively, in a self-alignment manner to thereby obtain a high-melting metallic silicide structure.

2. A method of manufacturing a semiconductor device according to claim 1, wherein the thin insulating film on the silicon substrate is a silicon oxide film.

3. A method of manufacturing a semiconductor device according to claim 1, wherein the gate electrode is composed of a polysilicon thin film.

* * * * *